United States Patent [19]

Sekiya

[11] Patent Number: 4,980,263
[45] Date of Patent: Dec. 25, 1990

[54] LIGHT-SENSITIVE DIAZO RESIN COMPOSITION WITH POLYURETHANE AND COMPOUND HAVING UREIDO, THIOUREIDO, URETHANE, OR THIOURETHANE UNIT

[75] Inventor: Toshiyuki Sekiya, Shizuoka, Japan

[73] Assignee: Fuji Photo Film Co., Ltd., Kanagawa, Japan

[21] Appl. No.: 317,868

[22] Filed: Mar. 2, 1989

[30] Foreign Application Priority Data

Mar. 3, 1988 [JP] Japan .................. 63-50163

[51] Int. Cl.$^5$ .................. G03F 7/021; G03F 7/016; G03C 1/61
[52] U.S. Cl. .................. 430/175; 430/158; 430/159; 430/160; 430/161; 430/176; 430/179; 430/302; 430/309; 430/331
[58] Field of Search .................. 430/175, 179, 176

[56] References Cited

U.S. PATENT DOCUMENTS

| | | | |
|---|---|---|---|
| 2,542,848 | 2/1951 | Von Glahn et al. | 430/179 |
| 2,727,820 | 12/1955 | Botkin et al. | 430/179 |
| 2,871,119 | 1/1959 | Weagar et al. | 430/176 |
| 3,386,828 | 6/1968 | Slimowicz et al. | 430/179 |
| 3,778,274 | 12/1973 | Inoue et al. | 430/179 |
| 3,873,316 | 5/1975 | Velton et al. | 430/179 |
| 4,275,138 | 6/1981 | Kita et al. | 430/175 |
| 4,401,744 | 8/1983 | Muller | 430/179 |
| 4,497,887 | 2/1984 | Watanabe et al. | 430/179 |
| 4,499,170 | 2/1985 | Amariti et al. | 430/179 |
| 4,741,985 | 5/1988 | Aoai et al. | 430/175 |

FOREIGN PATENT DOCUMENTS 2185120  7/1987  United Kingdom ................ 430/175

Primary Examiner—Charles L. Bowers, Jr.
Attorney, Agent, or Firm—Burns, Doane, Swecker & Mathis

[57] ABSTRACT

A light-sensitive composition comprises a diazo resin, a polymeric binder, and at least one compound having at least one structural unit selected from the group consisting of ureido bond, thioureido bond, urethane bond and thiourethane bond. The light-sensitive composition can suitably be used for preparing a presensitized plate for use in making lithographic printing plates and is excellent in developability with an aqueous alkaline developer.

7 Claims, No Drawings

LIGHT-SENSITIVE DIAZO RESIN COMPOSITION WITH POLYURETHANE AND COMPOUND HAVING UREIDO, THIOUREIDO, URETHANE, OR THIOURETHANE UNIT

BACKGROUND OF THE INVENTION

The present invention relates to a negative working light-sensitive composition and in particular to a light-sensitive composition suitably used for preparing a pre-sensitized plate for use in making lithographic printing plates, which is excellent in developability with an aqueous alkali developer.

Most of the materials which are used as light-sensitive substances for negative working presensitized plate for use in making lithographic printing plates (hereinafter referred to as "PS plate(s)") are diazonium compounds, and most commonly used are diazo resins such as a condensate of p-diazodiphenylamine and formaldehyde.

Compositions for the light-sensitive layer of PS plates in which a diazo resin is used can be divided into two groups, one of which simply comprises diazo resins, in other words those free of binders as disclosed in U.S. Pat. No. 2,714,066; and the other of which comprises a mixture of a diazo resin and a binder as disclosed in U.S. Pat. No. 4,275,138[Japanese Patent Un-examined Publication (hereunder referred to as "J.P. KOKAI") No. 50-30604]. However, most of the recent light-sensitive compositions for PS plates in which diazonium compounds are used comprises a diazonium compound and a polymer serving as a binder to achieve high printing durability.

As such a light-sensitive layer, there have been known so-called alkali-developable ones whose unexposed areas are removed or developed with an aqueous alkaline developer; and so-called solvent developable ones whose unexposed areas are removed with an organic solvent type developer as disclosed in U.S. Pat. No. 4,275,138[Japanese Patent Publication for Opposition Purpose (hereinafter referred to as "J.P. KOKOKU") No. 52-7364]. However, the alkali developable ones have become of major interest lately from the viewpoint of safety in work operations and health of operators. Examples of binders useful in such an alkaline developable light-sensitive layer include polymers obtained by copolymerizing 2-hydroxyethyl(meth)acrylate and a carboxyl group containing monomer such as methacrylic acid as disclosed in the aforesaid U.S. Pat. No. 4,275,138(J.P. KOKOKU No. 52-7364); polymers obtained by copolymerizing a monomer having aromatic hydroxyl group(s) and a carboxyl group containing monomer such as methacrylic acid as disclosed in J.P. KOKOKU No. 57-43890; polymers obtained by reacting residual hydroxyl groups of polyvinyl acetal resin with an acid anhydride and then reacting a part of the resultant carboxylic acid with a halogen compound having hydroxyl or cyano group(s) as described in U.S. Pat. No. 4,741,985(J.P. KOKAI No. 61-128123); polymers prepared by reacting sulfonyl isocyanate with a polymer having free OH group(s) as described in U.S. Pat. No. 3,732,105(J.P. KOKAI No. 47-9902); and polyurethane resins carrying substituents having acidic hydrogen atom(s) as described in DE No. 3716607A[Japanese Patent Application Serial (hereinafter referred to as "J.P.A.") No. 62-121666]. However, further improvement in the developability of these light-sensitive layers conventionally proposed have been required.

SUMMARY OF THE INVENTION

Accordingly, an object of the present invention is to provide a novel light-sensitive composition quite excellent in developability with an aqueous alkaline developer.

The inventors of the present invention have conducted various studies to achieve the foregoing object and have found that it can be attained by adding a specific additive to a light-sensitive composition. Thus, the inventors have completed the present invention.

According to the present invention, there is provided a light-sensitive composition which comprises a diazo resin and a polymeric binder, and the light-sensitive composition is characterized in that it further comprises at least one compound having at least one structural unit selected from the group consisting of ureido bond (=N—CO—N=), thioureido bond (=N—CS—N=), urethane bond (=N—CO—O—) and thiourethane bond (=N—CS—O—) (hereinafter referred to as "compound(s)" of the present invention).

DETAILED DESCRIPTION OF THE INVENTION

Specific examples of the compounds of the present invention include those represented by the following general formulas (1) to (4)

$(R_1)(R_2)N—CO—N(R_3)(R_4)$     (1)

$(R_1)(R_2)N—CS—N(R_3)(R_4)$     (2)

$(R_1)(R_2)N—CO—O—R_3$     (3)

$(R_1)(R_2)N—CS—O—R_3$     (4)

In the foregoing formulas (1) to (4), $R_1$ to $R_4$ may be the same or different and each represents a hydrogen atom, a substituted or unsubstituted alkyl group, a substituted or unsubstituted aryl group, a substituted or unsubstituted aralkyl group, a substituted or unsubstituted alkenyl group, a substituted or unsubstituted acyl group or a substituted or unsubstituted amino group.

More specifically, $R_1$ to $R_4$ each represents a methyl, ethyl, n-propyl, iso-propyl, n-butyl, iso-butyl, sec-butyl, tert-butyl, pentyl, hexyl, heptyl, octyl, 2-ethylhexyl, nonyl, decyl, lauryl, stearyl, behenyl, cyclopentyl, cyclohexyl, 2-hydroxyethyl, 2-hydroxypropyl, 3-hydroxypropyl, 2-methoxyethyl, 2-ethoxyethyl, 3-methoxypropyl, 3-ethoxypropyl, 2,3-dichloropropyl, 2,3-dibromopropyl, —CH$_2$COOH, —CH(COOH)—CH$_2$—COOH, —CH$_2$CH$_2$COOH, —CH$_2$CH$_2$SO$_3$Na, —CH$_2$CH$_2$SO$_3$K, phenyl, naphthyl, tolyl, xylyl, fluorophenyl, chlorophenyl, bromophenyl, ethylphenyl, propylphenyl, hydroxyphenyl, methoxyphenyl, ethoxyphenyl, —Phe—SO$_3$Na, —Phe—SO$_3$K, —Phe—NHNHCHO (wherein "Phe" means a phenylene group), benzyl, methylbenzyl, dimethylbenzyl, ethylbenzyl, propylbenzyl, fluorobenzyl, chlorobenzyl, bromobenzyl, hydroxybenzyl, methoxybenzyl, ethoxybenzyl, vinyl, propenyl, butenyl, allyl, —CO—CH$_3$, —CO—C$_2$H$_5$, —CO—OH, —CO—OCH$_3$, —CO—OC$_2$H$_5$, —CO—NH$_2$, —CO—COOH, —CO—CH$_2$COOH, —NH$_2$, —NHCH$_3$, —N(CH$_3$)$_2$, —NH—Ph and —N(Ph)$_2$ wherein "Ph" means a phenyl group). However, the present invention is not restricted to those specific examples.

Moreover, $R_1$ to $R_4$ may be bonded together to form a ring and the following compounds may be encompassed with the scope of this invention:

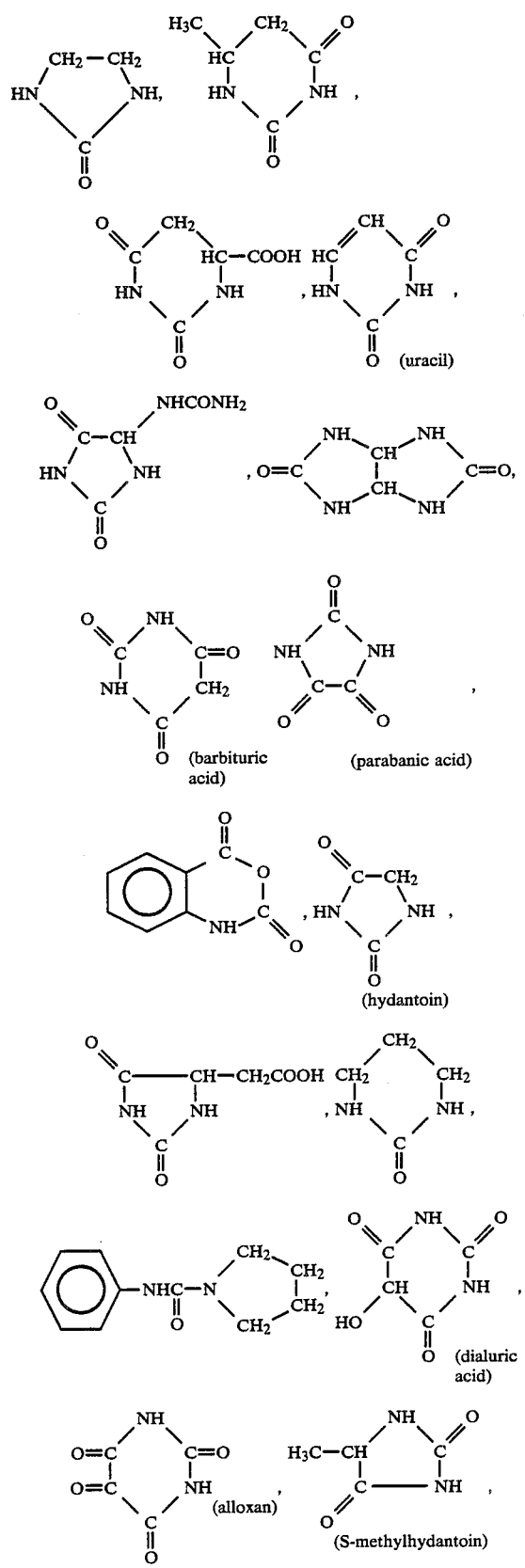

(uracil)

(barbituric acid)

(parabanic acid)

(hydantoin)

(dialuric acid)

(alloxan)

(S-methylhydantoin)

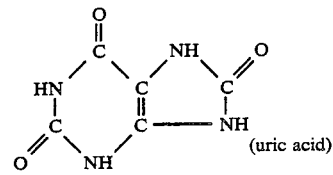

(uric acid)

The compounds of the present invention also include the following compounds which comprise two structural units in a molecule:

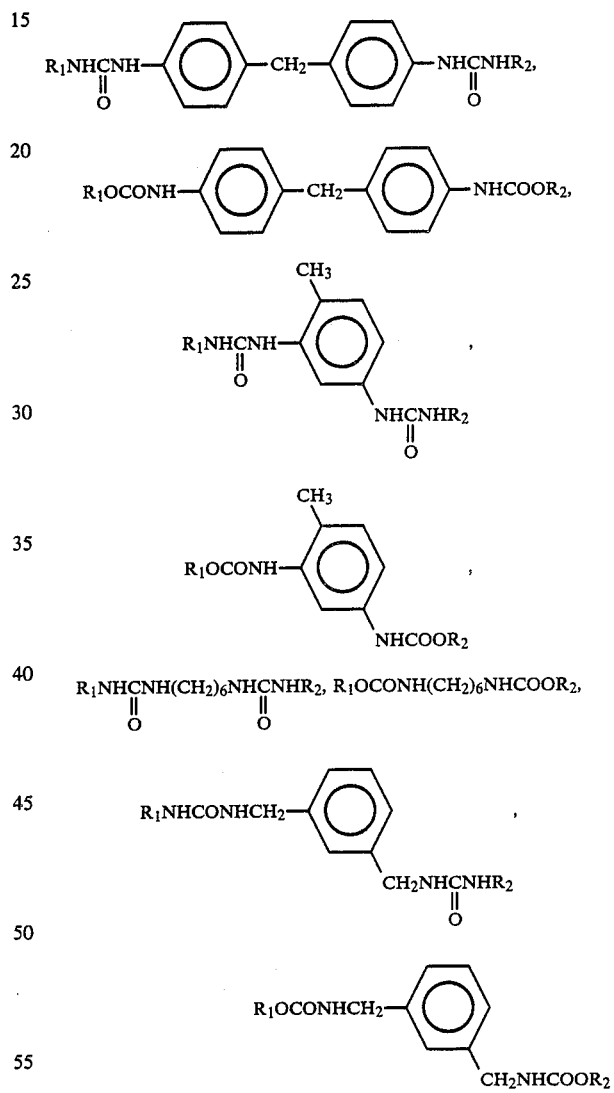

(wherein $R_1$ and $R_2$ have the same meanings as defined above).

The molecular weight of the compound of the present invention is preferably less than 20,000. This is because if the molecular weight thereof is excessively large, the effect of improving developability becomes low. More preferably, it is less than 5,000 and most preferably less than 1,000.

The amount of the compound of the present invention in the light-sensitive composition ranges from 1 to 25 wt %, preferably 2 to 20 wt % and more preferably 3 to 15 wt % based on the amount of the polymeric binder. This is because if it is less than 1 wt %, the developability improving effect is insufficient, while if it is more than 25 wt %, the printing durability of the resulting lithographic printing plate is impaired.

The light-sensitive diazo resins used in the present invention are diazo resins such as condensates of aromatic diazonium salts and active carbonyl group containing compounds, for instance, formaldehyde and particularly those soluble in organic solvents are preferably used in the invention.

Examples of such diazo resins are inorganic salts of organic solvent-soluble diazo resins which are reaction products of a condensate of p-diazodiphenylamine and formaldehyde or acetaldehyde with hexafluorophosphate or tetrafluoroborate; organic salts of organic solvent-soluble diazo resins which are reaction products of the foregoing condensate and sulfonates such as p-toluene sulfonic acid or salts thereof, propyl naphthalene sulfonic acid or salts thereof, butyl naphthalene sulfonic acid or salts thereof, dodecylbenzene sulfonic acid or salts thereof, 2-hydroxy-4-methoxybenzophenone-5-sulfonic acid or salts thereof, dioctylnaphthalene sulfonic acid or salts thereof or a mixture thereof, as described in J.P. KOKOKU No. 47-1167.

In addition to the foregoing examples, a product obtained by condensing 3-methoxy-4-diazodiphenylamine and 4,4'-bis-methoxymethyl-diphenyl ether and then converting it to a mesitylene sulfonate as disclosed in Can. Patent No. 1,172,492(J.P. KOKAI No. 58-27141) is also suitably employed in the invention.

The polymeric binders which can be used in the invention may be any polymeric binder so far as they can dissolve in or can get swollen with an aqueous alkaline developer and they are photohardened with the aforementioned light-sensitive diazo resins.

Particularly preferred organic polymeric binders include copolymers comprising, as an essential component, acrylic acid, methacrylic acid, crotonic acid or maleic acid, such as multicomponent copolymers of 2-hydroxyethyl acrylate or 2-hydroxyethyl methacrylate, acrylonitrile or methacrylonitrile, acrylic acid or methacrylic acid and optionally other copolymerizable monomers as disclosed in U.S. Pat. No. 4,123,276(J.P. KOKOKU No. 52-7364); multicomponent copolymers of acrylic acid or methacrylic acid esterified with a group whose terminus is a hydroxyl group and which has a dicarboxylic acid ester residue, acrylic acid or methacrylic acid and optionally other copolymerizable monomers as disclosed in J.P. KOKAI No. 53-120903; multicomponent copolymers of a monomer having terminal aromatic hydroxyl group (e.g., N-(4-hydroxyphenyl)methacrylamide), acrylic acid or methacrylic acid and optionally other copolymerizable monomers as disclosed in J.P. KOKOKU No. 57-43890; multicomponent copolymers of alkyl acrylates, acrylonitrile or methacrylonitrile and unsaturated carboxylic acid as disclosed in J.P. KOKAI No. 56-4144; and modified polyvinyl acetals as disclosed in U.S. Pat. Nos. 4,631,245 and 4,741,985(J.P. KOKAI Nos. 61-267042; 61-128123; and 62-58242).

Polyurethane resins as disclosed in BP No. 2185120(J.P. KOKAI Nos. 62-123452 and 62-123453) and DE No. 3716607A(J.P.A. No. 62-121666) are also preferred. They can improve the developability enhancing effect of the compounds of the present invention extremely and thus they are the most preferred polymeric binders to be combined with the light-sensitive diazo resin.

In addition to the foregoing polymeric binders, acidic polyvinyl alcohol derivatives and acidic cellulose derivatives are also useful. Also preferred are polymeric compounds which are polyvinyl acetals made alkali-soluble as disclosed in U.K. Pat. No. 1,370,316.

The amounts of these light-sensitive diazo resins and the polymeric binder in the light-sensitive composition of the invention suitably range from 3 to 40% by weight for the former and from 97 to 60% by weight for the latter based on the total weight of these two components. The sensitivity thereof becomes higher as the content of the diazo resin decreases, but if it is less than 3% by weight, photohardening of the binder becomes insufficient and thus the resulting photohardened film gets swollen with a developer during developing process, which possibly makes the film fragile. On the contrary, if the amount thereof is more than 40% by weight, the sensitivity of the light-sensitive layer obtained is lowered and the composition cannot be practically used. Therefore, a preferred amount of the diazo resin ranges from 5 to 30% by weight, and that of the polymeric binder ranges from 95 to 70% by weight.

The light-sensitive composition of the present invention may further comprise a variety of additives. For instance, there may be added, to the composition, alkyl ethers such as ethyl cellulose and methyl cellulose for improving coating properties of the composition; surfactants such as fluoro-surfactants; plasticizers such as tricresyl phosphate, dimethyl phthalate, dibutyl phthalate, trioctyl phosphate, tributyl phosphate, tributyl citrate, polyethylene glycol and polypropylene glycol, for imparting flexibility and wear resistance to the resulting film; coloring substances for making the image portions visible after development, such as acridine dyes, cyanine dyes, styryl dyes, triphenylmethane dyes or pigments such as phthalocyanine; or common stabilizers for the diazo resins such as phosphoric acid, phosphorous acid, pyrophosphoric acid, oxalic acid, boric acid, p-toluenesulfonic acid, benzenesulfonic acid, p-hydroxybenzenesulfonic acid, 2-methoxy-4-hydroxy-5-benzoylbenzenesulfonic acid, malic acid, tartaric acid, dipicolinic acid, polyacrylic acid and copolymers thereof, polyvinyl phosphonic acid and copolymers thereof, polyvinyl sulfonic acid and copolymers thereof, 5-nitronaphthalene-1-phosphonic acid, 4-chlorophenoxymethyl phosphonic acid, sodium phenyl-methyl-pyrazolone sulfonate, 2-phosphonobutane tricarboxylic acid-1.2.4, 1-phosphonoethane tricarboxylic acid-1.2.2, 1-hydroxyethane-1,1-diphosphonic acid. The amount of these additives to be added to the composition may vary depending on the kind of the composition and the purpose of the additives, but it in general ranges from 0.5 to 30% by weight on the basis of the total solid content of the light-sensitive layer.

The light-sensitive composition of this invention is dissolved in a proper organic solvent and then is applied to the surface of a substrate having a hydrophilic surface in an amount ranging from 0.5 to 5 g/m$^2$ which is expressed in the amount weighed after drying to obtain a PS plate. Upon coating the same, the concentration of the composition in an organic solvent preferably ranges from 1 to 50% by weight. Examples of organic solvents include methyl cellosolve, ethyl cellosolve, 1-methoxy-2-propanol, methyl cellosolve acetate, acetone, methyl ethyl ketone, methanol, dimethylformamide, dimethylsulfoxide, ethylene dichloride, cyclohexanone, dioxane and tetrahydrofuran. In addition to these solvents, mixed solvents thereof as well as these solvents and mixtures thereof containing a small amount of solvents such as water and toluene which do not dissolve the diazo resins and polymeric binders may also suitably be used. After applying the light-sensitive composition dissolved in such a solvent to the substrate, the layer applied is preferably dried at a temperature ranging from 50° to 120° C. The drying is carried out first at a rather low temperature and then at an elevated temperature. Alternatively, the coated layer may be directly dried at an elevated temperature by appropriately selecting the solvent and the concentration.

The PS plate composed of a substrate having a hydrophilic surface provided thereon with a light-sensitive layer applied is imagewise exposed to light and then is developed with a developer comprised of a weak alkaline water to form relief images negative with respect to the original. Light sources suitable for exposing the PS plate include, for instance, a carbon arc lamp, a mercury lamp, a xenon lamp, a metal halide lamp, a strobo, ultraviolet rays and laser rays. Examples of developers used for developing the PS plates having a layer of the composition of the present invention include weak alkaline aqueous solutions such as those composed of water, an organic solvent having a solubility in water of not more than 10% by weight at ordinary temperature (e.g., benzyl alcohol and ethylene glycol monophenyl ether), an alkaline agent (e.g., triethanolamine and monoethanolamine), an anionic surfactant (e.g., aromatic sulfonic acid salts, dialkylsulfosuccinic acid salts, alkylnaphthalene sulfonic acid salts, surfactants represented by the following general formulas:

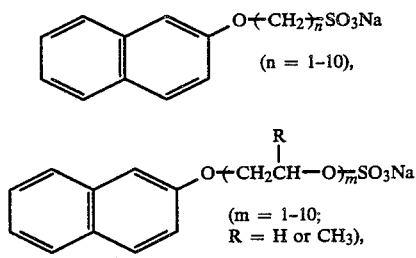

and branched alkylsulfuric acid ester salts), and those composed of water, optionally contamination inhibiting agents (e.g., sodium sulfite and sodium salt of sulfopyrazolone) and agents for softening hard water (e.g., tetrasodium ethylenediaminetetraacetate and a compound represented by the formula: $N(CH_2COONa)_3$).

As the substrate having hydrophilic surface to which the composition of the present invention is applied, particularly preferred are aluminum plates subjected to hydrophilization treatment. The surface of the aluminum plates are preferably grained by wire brush graining, brush graining in which the surface is grained with a nylon brush while pouring a slurry of abrasive particles thereon, ball graining, chemical graining, electrolytic graining or combined graining comprised of a combination of these graining techniques and then optionally anodized by passing an electric current (D.C. or A.C.) in an electrolyte composed of sulfuric acid, phosphoric acid, oxalic acid, boric acid, chromic acid, sulfamic acid or a mixture thereof to form a strong passive film on the surface. The hydrophilization of the surface of the aluminum plate can be achieved by the formation of such a passive film, but particularly preferred are those further subjected to the following treatment: a silicate (sodium silicate or potassium silicate) treatment as disclosed in U.S. Pat. Nos. 2,714,066 and 3,181,461; a treatment with a fluorozirconate as disclosed in U.S. Pat. No. 2,946,638; a phosphomolybdate treatment as disclosed in U.S. Pat. No. 3,201,247; a polyacrylic acid treatment as disclosed in German Patent No. 1,091,433; a polyvinyl sulfonic acid treatment as disclosed in German Patent No. 1,134,093 and U.K. Patent No. 1,230,447; a phosphonic acid treatment as disclosed in J.P. KOKOKU No. 44-6409; a phytic acid treatment as disclosed in U.S. Pat. No. 3,307,951; a combined treatment with a hydrophilic organic polymeric compound and a bivalent metal as disclosed in J.P. KOKAI Nos. 58-16893 and 58-18291; and a hydrophilization by application of an underlying coating of a water-soluble polymer having sulfonic acid group(s). Examples of such hydrophilization treatments include the silicate electrodeposition technique as disclosed in U.S. Pat. No. 3,658,662.

The light-sensitive composition of the present invention is superior in developability with an aqueous alkaline developer or shows very short developing time and, therefore, can suitably be used for preparing PS plates.

The present invention will hereinafter be explained in more detail with reference to the following non-limitative working Examples and further the effects practically achieved by the present invention will also be discussed in detail in comparison with the following Comparative Examples.

EXAMPLES 1 TO 35 AND COMPARATIVE EXAMPLE 1

The surface of an aluminum plate of 0.3 mm thick was grained with a nylon brush and an aqueous suspension of 400 mesh pumice stone and was sufficiently washed with water. The plate was then immersed in 10% aqueous solution of sodium hydroxide at 70° C. for 60 seconds to etch the same, followed by washing it with running water, neutralizing and washing with 20% nitric acid solution, and then electrolytically graining the plate by the electrochemical graining method as disclosed in J.P. KOKAI No. 53-67507, in other words electrolytically graining the plate in 1% aqueous nitric acid solution utilizing an alternating waved current of $V_A=12.7$ V and $V_C=9.1$ V so that the quantity of electricity at the anode time was 160 coulomb/dm². Subsequently, the aluminum plate was immersed in 30% aqueous sulfuric acid solution at 55° C. for two minutes to desmut the plate and was anodized in 7% sulfuric acid aqueous solution till the thickness of the resultant anodized film was 2.0 g/m². Thereafter, the plate was immersed in 3% aqueous solution of sodium silicate maintained at 70° C. for one minute, then washed with water and dried. A solution of a light-sensitive composition having the following composition was applied to the surface of the aluminum plate thus prepared with a whirler and then dried at 80° C. for two minutes. The amount of the composition coated was 1.5 g/m² (weighed after drying).

| The Solution of the Light-sensitive Composition | |
|---|---|
| Component | Amount |
| 4-(n-dodecyl)-benzene sulfonic acid salt of the condensate of 4-diazodiphenylamine and formaldehyde | 1.0 g |

-continued

| The Solution of the Light-sensitive Composition | |
|---|---|
| Component | Amount |
| Polymer (a) | 5.0 g |
| Compound listed in Table I | 0.5 g |
| Malic acid | 0.05 g |
| FC-430 (fluoro-surfactant available from 3M Co., Ltd. U.S.A.) | 0.05 g |
| Oil-soluble dye (Victoria Pure Blue BOH) | 0.1 g |
| 1-Methoxy-2-propanol | 60 g |
| Methanol | 20 g |
| Methyl ethyl ketone | 20 g |

In the composition, the polymer (a) was a polyurethane resin having carboxyl groups and hydroxyl groups prepared according to preparation Example 9 of J.P. KOKAI No. 62-123453. Likewise, a comparative PS plate was produced in the same manner as mentioned above except for using the light-sensitive composition free of the compound of the present invention (Comparative Example).

A developer obtained by diluting the aqueous alkaline developer DN-3C (available from Fuji Photo Film Co., Ltd.; dilution=1:2) was dropped on the surface of these PS plates, the surface thereof was rubbed with a sponge after a constant time period while washing with water to estimate the time required for completely developing the PS plates (developing time). The results observed are summarized in Table I given below.

TABLE I

| Ex. No. | Compound Used | Developing time |
|---|---|---|
| 1 | $H_2N-C(=O)-NH_2$ | 20 sec. |
| 2 | $(CH_3)(H)N-C(=O)-N(H)(CH_3)$ | 30 sec. |
| 3 | $(C_2H_5)(H)N-C(=O)-N(H)(C_2H_5)$ | 20 sec. |
| 4 | $(nC_4H_9)(H)N-C(=O)-N(H)(nC_4H_9)$ | 40 sec. |
| 5 | $(nC_4H_9)(H)N-C(=O)-N(H)(CH_2CH_2OCH_3)$ | 25 sec. |
| 6 | $(nC_4H_9)(H)N-C(=O)-N(H)(CH_2CH_2CH_2OC_2H_5)$ | 20 sec. |
| 7 | $(C_6H_5)(H)N-C(=O)-NH_2$ | 25 sec. |
| 8 | $(C_6H_5)(H)N-C(=O)-N(C_2H_5)_2$ | 25 sec. |
| 9 | $(C_6H_5)(H)N-C(=O)-N(H)(nC_{18}H_{37})$ | 50 sec. |

TABLE I-continued

| Ex. No. | Compound Used | Developing time |
|---|---|---|
| 10 | C₆H₅–NH–C(=O)–NH–CH(CH₂CH₂SO₃Na)–H (phenyl-NH-CO-NH-CH(H)-CH₂CH₂SO₃Na) | 40 sec. |
| 11 | C₂H₅–NH–C(=O)–NH–CH(H)–(4-SO₃Na-C₆H₄) | 40 sec. |
| 12 | C₆H₅CH₂–NH–C(=O)–NH–CH(H)($^n$C₄H₉) | 30 sec. |
| 13 | CH₂=CHCH₂–N(H)–C(=S)–N(H)(H) | 35 sec. |
| 14 | (cyclohexyl)(H)N–C(=S)–N(H)(cyclohexyl) | 45 sec. |
| 15 | C₆H₅–NH–N(H)–C(=O)–N(H)–NH–C₆H₅ | 30 sec. |
| 16 | H₂N–C(=O)–NH–CH(H)[CH(COOH)CH₂COOH] | 40 sec. |
| 17 | H₂N–C(=O)–NH–CH(H)(CH₂COOH) | 40 sec. |
| 18 | H₂N–C(=O)–NH–CH(H)(CONH₂) | 45 sec. |
| 19 | H₂N–C(=O)–O–CH₃ | 30 sec. |
| 20 | CH₃–N(H)–C(=O)–O–C₂H₅ | 35 sec. |
| 21 | (C₂H₅)₂N–C(=O)–O–C₂H₅ | 30 sec. |

TABLE I-continued
| Ex. No. | Compound Used | Developing time |
|---|---|---|
| 22 | 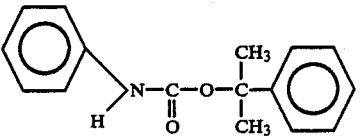 | 25 sec. |
| 23 | 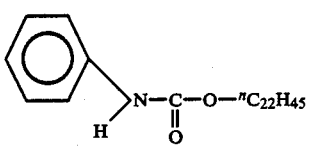 | 50 sec. |
| 24 | 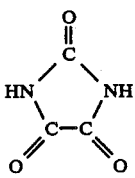 | 45 sec. |
| 25 | 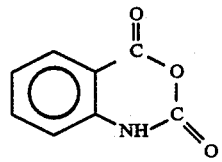 | 40 sec. |
| 26 | 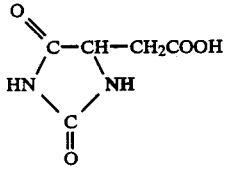 | 35 sec. |
| 27 | 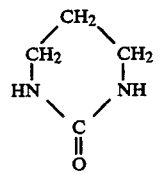 | 40 sec. |
| 28 | 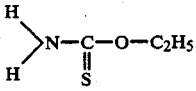 | 45 sec. |
| 29 | 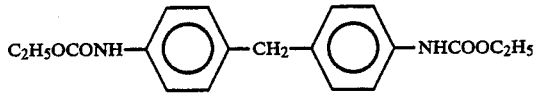 | 30 sec. |
| 30 | 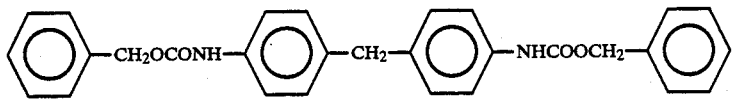 | 50 sec. |
| 31 | HOCH$_2$CH$_2$OCONH(CH$_2$)$_6$NHCOOCH$_2$CH$_2$OH | 20 sec. |
| 32 | HOCH$_2$CH$_2$OCONH—⟨phenyl⟩—CH$_2$—⟨phenyl⟩—NHCOOCH$_2$CH$_2$OH | 20 sec. |

TABLE I-continued

| Ex. No. | Compound Used | Developing time |
|---|---|---|
| 33 | 4-methyl-1,3-phenylene bis(2-hydroxyethyl urea): HOCH$_2$CH$_2$NHC(O)NH—[C$_6$H$_3$(CH$_3$)]—NHC(O)NHCH$_2$CH$_2$OH | 30 sec. |
| 34 | HOCH$_2$CH$_2$OCONHCH$_2$—[C$_6$H$_4$]—CH$_2$NHCOOCH$_2$CH$_2$OH | 20 sec. |
| 35 | HOCH$_2$CH$_2$OCONH—[C$_6$H$_3$(CH$_3$)]—NHCOOCH$_2$CH$_2$OH | 30 sec. |
| Comp. Ex. 1 | — | 60 sec. |

The results listed in Table I indicate that the PS plates in which the compound of the present invention was used can be developed with an aqueous alkaline developer within a short period of time and that they are excellent in developability.

EXAMPLES 36 TO 38 AND COMPARATIVE EXAMPLE 2

A solution of the light-sensitive composition having the following composition was applied to the surface of an aluminum plate treated as in Example 1 with a whirler and was dried at 100° C. for two minutes. The coated amount of the composition was 2.4 g/m$^2$ weighed after drying.

| Composition of the Solution | |
|---|---|
| Component | Amount (g) |
| Hexafluorophosphoric acid salt of the condensate of 4-diazodiphenylamine and formaldehyde | 0.5 |
| Polymer (b) | 5.0 |
| Compound listed in Table II | 0.5 |

| Composition of the Solution | |
|---|---|
| Component | Amount (g) |
| Phosphorous acid | 0.1 |
| FC-430 | 0.05 |
| Oil-soluble Paint (Victoria Pure Blue BOH) | 0.1 |
| 2-Methoxyethanol | 100 |

In this connection, the polymer (b) was a copolymer of 2-hydroxyethyl methacrylate/acrylonitrile/methyl methacrylate/methacrylic acid (molar ratio of copolymerization=35/35/25/5) having an average molecular weight of 12,000. Likewise, a comparative PS plate was prepared in the same manner as mentioned above except that the compound of the present invention was not used (Comparative Example 2).

Developing time of these PS plates was determined in the same manner as in Examples 1 to 35. The results observed are listed in Table II given below.

TABLE II

| Ex. No. | Compound Used | Developing time |
|---|---|---|
| 36 | $^n$C$_4$H$_9$(H)N—C(=O)—N(H)CH$_2$CH$_2$CH$_2$OC$_2$H$_5$ | 50 sec. |
| 37 | CH$_2$=CHCH$_2$(H)N—C(=S)—N(H)H | 55 sec. |
| 38 | HOCH$_2$CH$_2$OCONH—[C$_6$H$_4$]—CH$_2$—[C$_6$H$_4$]—NHCOOCH$_2$CH$_2$OH | 45 sec. |
| 2 | — | 60 sec. |

As seen from the results shown in Table II, the PS plates in which the compound of the present invention was used can be developed with an aqueous alkaline developer within a very short period of time and they are excellent in developability.

What is claimed is:

1. A light-sensitive composition comprising an admixture of:
   (i) a light-sensitive diazo condensate of an aromatic diazonium salt;
   (ii) a polyurethane resin soluble or swellable in an aqueous alkaline developer as a polymeric binder; and
   (iii) at least one compound having at least one structural unit selected from the group consisting of a ureido unit, a thioureido unit, a urethane unit and a thiourethane unit, said compound having a molecular weight of less than 5,000;
   wherein the amount of the light-sensitive diazo condensate (i) ranges from 5 to 30% by weight, the amount of the polyurethane resin (ii) ranges from 70 to 95% by weight based on the total weight of the two components, and wherein the amount of the compound (iii) ranges from 1 to 25% by weight based on the weight of the polyurethane resin.

2. A light-sensitive composition of claim 1, wherein the compound is at least one member selected from the group consisting of those represented by the following general formulas (1) to (4):

$$N(R_1)(R_2)—CO—N(R_3)(R_4) \quad (1)$$

$$N(R_1)(R_2)—CS—N(R_3)(R_4) \quad (2)$$

$$N(R_1)(R_2)—CO—O—R_3 \quad (3)$$

$$N(R_1)(R_2)—CS—O—R_3 \quad (4)$$

wherein $R_1$ to $R_4$ may be the same or different and each represents a hydrogen atom, a substituted or unsubstituted alkyl, a substituted or unsubstituted aryl, a substituted or unsubstituted aralkyl, a substituted or unsubstituted alkenyl, a substituted or unsubstituted acyl or a substituted or unsubstituted amino group or may be bonded together to form a ring structure.

3. A light-sensitive composition of claim 2 wherein $R_1$ to $R_4$ each represents a group selected from the group consisting of methyl, ethyl, n-propyl, iso-propyl, n-butyl, iso-butyl, sec-butyl, tert-butyl, pentyl, hexyl, heptyl, octyl, 2-ethylhexyl, nonyl, decyl, lauryl, stearyl, behenyl, cyclopentyl, cyclohexyl, 2-hydroxyethyl, 2-hydroxypropyl, 3-hydroxypropyl, 2-methoxyethyl, 2-ethoxyethyl, 3-methoxypropyl, 3-ethoxypropyl, 2,3-dichloropropyl, 2,3-dibromopropyl, —CH$_2$COOH, —CH(COOH)—CH$_2$—COOH, —CH$_2$CH$_2$COOH, —CH$_2$CH$_2$SO$_3$Na, —CH$_2$CH$_2$SO$_3$K, phenyl, naphthyl, tolyl, xylyl, fluorophenyl, chlorophenyl, bromophenyl, ethylphenyl, propylphenyl, hydroxyphenyl, methoxyphenyl, ethoxyphenyl, —Phe—SO$_3$Na, —Phe—SO$_3$K, —Phe—NHNHCHO (Phe means a phenylene group), benzyl, methylbenzyl, dimethylbenzyl, ethylbenzyl, propylbenzyl, fluorobenzyl, chlorobenzyl, bromobenzyl, hydroxybenzyl, methoxybenzyl, ethoxybenzyl, vinyl, propenyl, butenyl, allyl, —CO—CH$_3$, —CO—C$_2$H$_5$, —CO—OH, —CO—OCH$_3$, —CO—OC$_2$H$_5$, —CO—OC$_2$H$_5$, —CO—NH$_2$, —CO—COOH, —CO—CH$_2$COOH, —NH$_2$, —NHCH$_3$, —N(CH$_3$)$_2$, —NH—Ph and —N(Ph)$_2$ (Ph means a phenyl group).

4. A light-sensitive composition of claim 1 wherein the compound is at least one member selected from the group consisting of those represented by the following formulas:

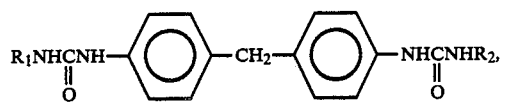

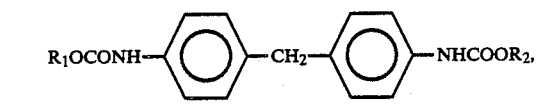

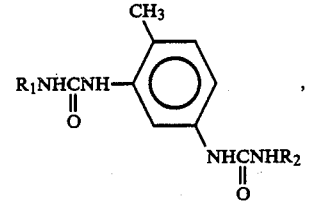

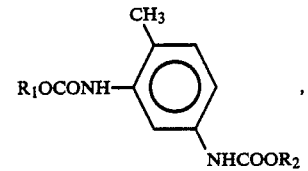

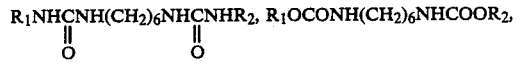

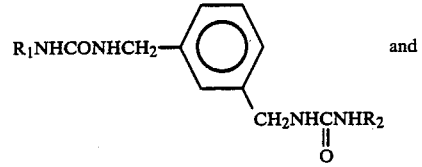

and

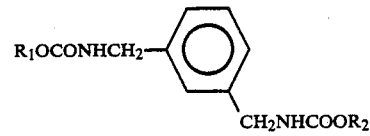

wherein $R_1$ and $R_2$ have the same meanings as defined above.

5. A light-sensitive composition according to claim 1, wherein the amount of the compound added in the composition ranges from 2 to 20% by weight based on the weight of the polyurethane resin.

6. A light-sensitive composition of claim 1 wherein it further comprises at least one additive selected from the group consisting of alkyl ethers, surfactants, plasticizers, dyes or pigments and stabilizers for the diazo resin.

7. A light-sensitive composition of claim 6 wherein the amount of the additive ranges from 0.5 to 30% by weight on the basis of the total solid content of the composition.

* * * * *